US008670738B2

(12) United States Patent
Tsuie

(10) Patent No.: US 8,670,738 B2
(45) Date of Patent: Mar. 11, 2014

(54) IMBALANCE COMPENSATOR FOR CORRECTING MISMATCH BETWEEN IN-PHASE BRANCH AND QUADRATURE BRANCH, AND RELATED IMBALANCE COMPENSATION METHOD AND DIRECT CONVERSION RECEIVING APPARATUS THEREOF

(75) Inventor: Yih-Ming Tsuie, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 220 days.

(21) Appl. No.: 13/236,611

(22) Filed: Sep. 19, 2011

(65) Prior Publication Data

US 2013/0069738 A1    Mar. 21, 2013

(51) Int. Cl.
*H04B 1/10* (2006.01)
*H04B 1/30* (2006.01)

(52) U.S. Cl.
CPC .................................... *H04B 1/30* (2013.01)
USPC ........... 455/296; 455/304; 455/306; 455/311; 455/226.1

(58) Field of Classification Search
USPC .................. 455/296, 302, 304, 306, 308, 311
See application file for complete search history.

(56) References Cited

U.S. PATENT DOCUMENTS

| 4,953,182 | A | * | 8/1990 | Chung | 375/344 |
| 5,705,949 | A | * | 1/1998 | Alelyunas et al. | 329/304 |
| 6,009,317 | A | * | 12/1999 | Wynn | 455/296 |
| 6,377,620 | B1 | * | 4/2002 | Ozluturk et al. | 375/235 |
| 7,636,558 | B2 | * | 12/2009 | Olson | 455/226.1 |
| 7,783,273 | B2 | * | 8/2010 | Maeda et al. | 455/285 |
| 7,944,984 | B1 | * | 5/2011 | Wu et al. | 375/261 |
| 8,265,584 | B2 | * | 9/2012 | Khoury et al. | 455/296 |
| 2005/0135521 | A1 | * | 6/2005 | Nemer et al. | 375/350 |

* cited by examiner

*Primary Examiner* — Duc M Nguyen
(74) *Attorney, Agent, or Firm* — Winston Hsu; Scott Margo

(57) ABSTRACT

An imbalance compensator includes a phase/filter mismatch correction circuit and a gain mismatch correction circuit. The phase/filter mismatch correction circuit includes an adjustable filter and a processing unit. The adjustable filter is arranged for adjusting a filter coefficient setting according to a first input signal of a first signal branch and a second input signal of a second signal branch, and generating a first compensated signal to the first signal branch according to the filter coefficient setting and the first input signal. The processing unit is arranged for processing the second input signal according to the first compensated signal and generating a second compensated signal to the second signal branch. The gain mismatch correction circuit is arranged for referring to the first and second compensated signals to configure gain compensation, and applying the configured gain compensation to one of the first and second compensated signals.

18 Claims, 6 Drawing Sheets

IMBALANCE COMPENSATOR FOR CORRECTING MISMATCH BETWEEN IN-PHASE BRANCH AND QUADRATURE BRANCH, AND RELATED IMBALANCE COMPENSATION METHOD AND DIRECT CONVERSION RECEIVING APPARATUS THEREOF

BACKGROUND

The disclosed embodiments of the present invention relate to signal reception, and more particularly, to an imbalance compensator for correcting mismatch between an in-phase branch and a quadrature branch, and related imbalance compensation method and direct conversion receiving apparatus thereof.

A direct conversion receiving (DCR) structure, also known as zero-IF receiver, is a receiver design that demodulates the incoming radio frequency signal by using a local oscillator (LO) signal whose frequency is identical to or very close to the carrier frequency of a wanted signal. In general, the DCR structure has some advantages such as high chip integration, low cost, low power consumption, small form factor, etc. However, the DCR structure may also have some disadvantages such as DC offset, flicker noise, etc. More specifically, when a quadrature down-conversion scheme is employed for feeding the signal to an in-phase (I) branch and a quadrature (Q) branch and then down-converting the I signal and Q signal by LO signals requiring a 90-degree phase difference therebetween, the practical DCR structure may generate a corrupted baseband signal output due to I/Q mismatch, including gain mismatch, phase mismatch, and filter mismatch effects. Hence, an imbalance compensation scheme is required for correcting the undesired mismatch.

One conventional offline imbalance compensation scheme employs a two-stage correction which performs a filter/gain mismatch compensation, and an oscillator phase mismatch compensation, sequentially. Only after the filter/gain mismatch correction is accomplished, the oscillator mismatch correction is allowed to be started. Thus, the two-stage correction is time-consuming task. Moreover, due to the inherent characteristics of the two-stage correction using a compensator implemented in the digital domain, additional switch devices are also introduced to the DCR structure for properly controlling the execution sequence of the filter/gain mismatch correction and the oscillator mismatch correction. For example, a first switch device is disposed between the in-phase branch mixer and the in-phase branch low-pass filter, a second switch device is disposed between the quadrature branch mixer and the quadrature branch low-pass filter, a third switch device is employed to control if a calibration/test signal generated from a calibration source is fed into the in-phase branch mixer and quadrature branch mixer, and a fourth switch device is employed to control if the calibration/test signal generated from the calibration source is fed into the in-phase branch low-pass filter and quadrature branch low-pass filter. During the filter/gain mismatch correction procedure, the first switch device, second switch device, and third switch device are all switched off, whereas the fourth switch device is switched on. During the oscillator mismatch correction procedure, the first switch device, second switch device, and third switch device are all switched on, whereas the fourth switch device is switched off. Unfortunately, these switch devices may introduce correction precision uncertainty since the switch devices might also have mismatch concern, which in turn requires a more complicated adaptive filter section implemented in the conventional digital-domain compensator.

Thus, there is a need for an innovative imbalance compensation scheme which is capable of correcting the mismatch effect efficiently and precisely.

SUMMARY

In accordance with exemplary embodiments of the present invention, an imbalance compensator for correcting mismatch between an in-phase branch and a quadrature branch, and related imbalance compensation method and direct conversion receiving apparatus thereof are proposed to solve the above-mentioned problems.

According to a first aspect of the present invention, an imbalance compensator for correcting a phase/filter mismatch and a gain mismatch between a first signal branch and a second signal branch is disclosed. One of the first and second signal branches is an in-phase branch, and the other of the first and second signal branches is a quadrature branch. The imbalance compensator includes a phase/filter mismatch correction circuit and a gain mismatch correction circuit. The phase/filter mismatch correction circuit includes an adjustable filter and a processing unit. The adjustable filter is disposed on the first signal branch, and arranged for adjusting a filter coefficient setting according to a first input signal of the first signal branch and a second input signal of the second signal branch, and generating a first compensated signal to the first signal branch according to the filter coefficient setting and the first input signal. The processing unit is disposed on the second signal branch, and arranged for processing the second input signal according to the first compensated signal and accordingly generating a second compensated signal. The gain mismatch correction circuit is arranged for referring to the first and second compensated signals to configure gain compensation, and applying the configured gain compensation to a specific compensated signal being one of the first and second compensated signals.

According to a second aspect of the present invention, an imbalance compensation method for correcting a phase/filter mismatch and a gain mismatch between a first signal branch and a second signal branch is disclosed. One of the first and second signal branches is an in-phase branch, and the other of the first and second signal branches is a quadrature branch. The imbalance compensation method includes: performing a phase/filter mismatch correction and performing a gain correction. The step of performing the phase/filter mismatch correction includes: adjusting a filter coefficient setting according to a first input signal of the first signal branch and a second input signal of the second signal branch; performing a filtering operation upon the first input signal according to the filter coefficient setting, and accordingly generating a first compensated signal; and processing the second input signal according to the first compensated signal and accordingly generating a second compensated signal. The step of performing the gain mismatch correction includes: referring to the first and second compensated signals to configure gain compensation; and applying the configured gain compensation to a specific compensated signal being one of the first and second compensated signals.

According to a third aspect of the present invention, a direct conversion receiving (DCR) apparatus is disclosed. The DCR apparatus includes a first mixer, a second mixer, a first filter, a second filter, and an imbalance compensator. The first mixer is disposed on a first signal branch, and arranged for generating a first mixer output according to a first clock signal and the calibration signal when the DCR apparatus is operated in a calibration mode. The second mixer is disposed on a second signal branch, and arranged for generating a second mixer output according to a second clock signal and the calibration signal when the DCR apparatus is operated in a calibration mode, wherein one of the first and second signal branches is an in-phase branch, and the other of the first and second signal branches is a quadrature branch. The first filter is arranged for generating a first input signal of the first signal branch according to the first mixer output. The second filter is arranged for generating a second input signal of the second signal branch according to the second mixer output. The imbalance compensator is coupled to the first and second filters, and arranged for correcting a phase/filter mismatch and a gain mismatch between the first signal branch and the second signal branch according to the first and second input signals. The first filter is consistently coupled to the first mixer and the second filter is consistently coupled to the second mixer no matter whether the imbalance compensator is correcting the phase/filter mismatch or the gain mismatch.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

The conception of the present invention is to provide a simultaneous filter and oscillator mismatch correction (i.e., a simultaneous gain/filter and phase mismatch correction) without using additional switch device(s) to separate/isolate an oscillator mismatch correction (i.e., a phase and gain mismatch correction) from a filter mismatch correction (i.e., a gain/filter mismatch correction). In this way, the filter mismatch and phase mismatch can be corrected efficiently and precisely. Further details are described hereinafter.

Figure 1:
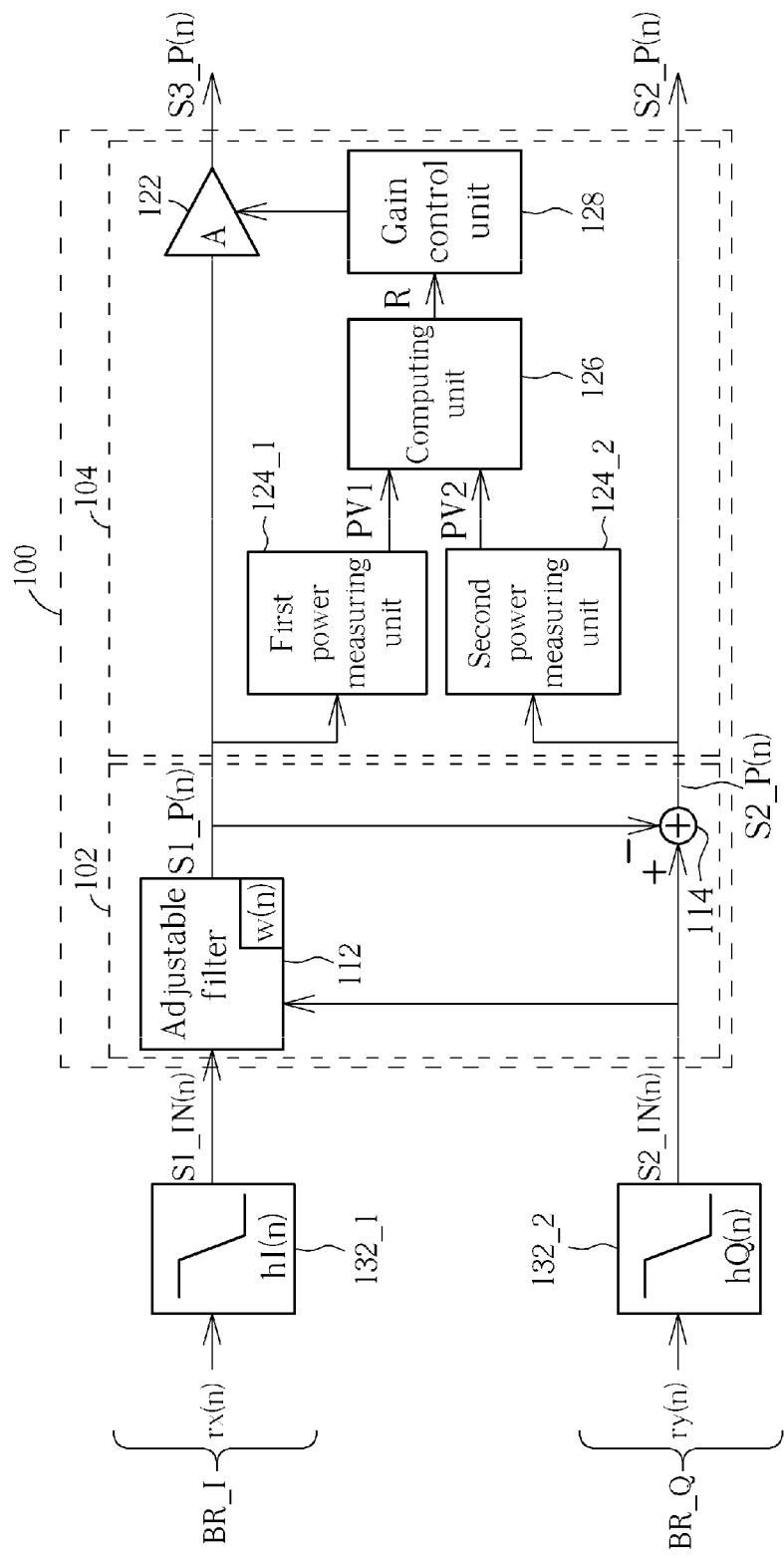
FIG. 1 is a diagram illustrating an imbalance compensator according to a first exemplary embodiment of the present invention.

Please refer to FIG. 1, which is a diagram illustrating an imbalance compensator according to a first exemplary embodiment of the present invention. The exemplary imbalance compensator 100 is used for correcting a phase mismatch and a filter mismatch between two signal branches, including an in-phase branch BR_I and a quadrature branch BR_Q. The left part before the compensator 100 in FIG. 1 represents the mismatch model, which includes the phase/gain imbalance (introduced due to input signals fed to the filter pair 132_1 and 132_2) and the filter imbalance (introduced due to the filter pair 132_1 and 132_2). Since, when confronted with the imbalance problem, only the mismatched part is concerned; filter 132_1 can be seen as the in-phase mismatched filter with respect to a reference low-pass filter, while filter 132_2 can be seen as the quadrature mismatched filter with respect to the same reference low-pass filter.

The imbalance compensator 100 includes, but is not limited to, a phase/filter mismatch correction circuit 102 and a gain mismatch correction circuit 104. Regarding the phase/filter mismatch correction circuit 102, it includes an adjustable filter 112 disposed on the in-phase branch BR_I and a processing unit (e.g., a subtractor 114) disposed on the quadrature branch BR_Q. Regarding the gain correction circuit 104, it includes a gain adjusting unit, 122, a first power measuring unit 124_1, a second power measuring unit 124_2, a computing unit 126, and a gain control unit 128. The phase/filter mismatch correction circuit 102 is implemented for decoupling the crosstalk between the in-phase and quadrature phase signals and making the resulted signals experience the same low-pass filtering effect, except for a gain difference. The gain correction circuit 104 is implemented for making outputs generated to the in-phase branch BR_I and the quadrature branch BR_Q substantially have the same gain applied thereto.

Suppose that the actual mixer outputs rx(n) and ry(n) are cross-talk results due to mixer phase and gain mismatches, and a calibration signal source (not shown) is employed for generating a white noise signal u(n) as a calibration signal fed into mixers disposed on the in-phase branch BR_I and the quadrature branch BR_Q. Ideally, when there is no mixer gain and phase mismatch, the mixer outputs x(n) and y(n) may be simply expressed as follows.

$$x(n)=u(n)\cos(\omega n) \quad (1)$$

$$y(n)=u(n)(-\sin(\omega n)) \quad (2)$$

However, when the mixer gain mismatch g and mixer phase mismatch $\phi$ are taken into consideration, the actual mixer outputs rx(n) and ry(n) may be expressed as follows.

$$rx(n)=x(n)=u(n)\cos(\omega n) \quad (3)$$

$$ry(n)=u(n)g(-\sin(\omega n-\phi))=gy(n)\cos(\phi)+gx(n)\sin(\phi) \quad (4)$$

The crosstalk effect is easily seen in equation (4) since it contains the original in-phase signal x(n) and the original quadrature signal y(n). Next, suppose that the following low-pass filters 132_1 and 132_2 respectively disposed on the in-phase branch BR_I and the quadrature branch BR_Q do not match each other. For example, the transfer function hI(n) of the low-pass filter 132_1 has a unity gain (i.e., hI(n)=δ(n)), which is the natural choice if we take the in-phase branch low-pass filter as the reference low-pass filter, and the transfer function hQ(n) of the low-pass filter 132_2 is different from the transfer function hI(n) (i.e., hQ(n)≠hI(n)). Hence, a first input signal S1_IN of the in-phase branch BR_I and a second input signal S2_IN of the quadrature branch BR_Q may be expressed as follows.

$$S1\_IN(n)=rx(n)*hI(n)=x(n)*\delta(n)=x(n) \quad (5)$$

$$S2\_IN(n)=ry(n)*hQ(n)=gy(n)\cos(\phi)*hQ(n)+gx(n)\sin(\phi)*hQ(n) \quad (6)$$

In above equations (5) and (6), the symbol "*" represents a convolution operator. As mentioned above, the phase/filter mismatch correction circuit 102 is implemented for decoupling the crosstalk between the in-phase and quadrature phase signals and making the resulted signals experience the same low-pass filtering effect, except for a gain difference. In this exemplary embodiment, the adjustable filter 112 is disposed on the in-phase branch BR_I, and arranged for adjusting a filter coefficient setting w(n) according to the first input signal S1_IN(n) and the second input signal S2_IN(n), and then generating a first compensated signal S1_P(n) to the in-phase branch BR_I according to the filter coefficient setting w(n) and the first input signal S1_IN(n).

By way of example, but not limitation, the adjustable filter 112 employs a system identification method (SID) for adjusting the filter coefficient setting w(n). As shown in above equations (1) and (2), the mixer output x(n) is independent of the mixer output y(n) (i.e., the mixer outputs x(n) and y(n) are uncorrelated/orthogonal). Hence, only the term gx(n)sin(ϕ)*hQ(n) included in the second input signal S2_IN(n) is tracked for iteratively tuning the filter coefficient setting w(n). After the filter coefficient setting w(n) is properly adjusted due to SID, the first compensated signal S1_P(n) generated from the adjustable filter 112 may be expressed as follows.

$$S1\_P(n)=S1\_IN(n)\cdot w(n)=g\sin(\phi)hQ(n)*x(n) \quad (7)$$

As shown in FIG. 1, a processing unit is disposed on the quadrature branch BR_Q for processing the second input signal S2_IN(n) according to the first compensated signal S1_P(n) and accordingly generating a second compensated signal S2_P(n). In this exemplary embodiment, the processing unit is implemented by the subtractor 114, which generates the second compensated signal S2_P(n) by subtracting the first compensated signal S1_P(n) from the second input signal S2_IN(n). Therefore, the second compensated signal S2_P(n) may be expressed as follows.

$$S2\_P(n)=S2\_IN(n)-S1\_P(n)=g\cos(\phi)hQ(n)*y(n) \quad (8)$$

As can be readily known from above equations (1), (2), (7) and (8), the first compensated signal S1_P(n) and the second compensated signal S2_P(n) are crosstalk-decoupled compared with their inputs. Since the net effect on the in-phase signal x(n) is g sin(ϕ)hQ(n), and the net effect on quadrature signal y(n) is g cos(ϕ)hQ(n), only a gain mismatch effect sin(ϕ)/cos(ϕ) is left after phase/filter mismatch correction circuit 102. Thus, the phase and filter mismatches are correctly removed by the use of phase/filter mismatch correction circuit 102, and only the gain mismatch problem remains unsolved.

In this exemplary embodiment, the gain mismatch correction circuit 104 is arranged for referring to the first and second compensated signals S1_P(n) and S2_P(n) to configure gain compensation A, and applying the configured gain compensation A to the first compensated signal S1_P(n) for solving the gain mismatch problem. As shown in FIG. 1, the gain mismatch correction circuit 104 is always coupled to the phase/filter mismatch correction circuit 102. This implies that the gain mismatch correction circuit 104 is consistently cascaded to the phase/filter mismatch correction circuit 102 while the phase/filter mismatch correction circuit 102 is adjusting the filter coefficient setting w(n) and the gain mismatch correction circuit 104 is configuring the gain compensation A. In other words, while the phase/filter mismatch correction is performed, the gain mismatch correction is also active to process the first and second compensated signals S1_P(n) and S2_P(n) generated due to the phase/filter mismatch correction.

The first power measuring unit 124_1 is arranged for generating a first power value PV1 indicative of signal power of the first compensated signal S1_P(n). The second power measuring unit 124_2 is arranged for generating a second power value PV2 indicative of signal power of the second compensated signal S2_P(n). The computing unit 126 is arranged for calculating a square-root power ratio value R according to the first power value PV1 and the second power value PV2. In this exemplary embodiment, the square-root power ratio value R may be expressed as follows.

$$R=\sqrt{\frac{PV2}{PV1}}=\sqrt{\frac{(g\cos(\phi)hQ(n))^2}{(g\sin(\phi)hQ(n))^2}}=\left|\frac{\cos(\phi)}{\sin(\phi)}\right| \quad (9)$$

The gain control unit 128 is arranged for controlling the gain adjusting unit A according to the square-root power ratio value R. For example, the gain adjusting unit A may be expressed as follows.

$$A=\text{Sign}\left(\frac{S2\_P(n)}{S1\_P(n)}\right)\cdot R=\text{Sign}\left(\frac{\cos(\phi)}{\sin(\phi)}\right)\cdot\left|\frac{\cos(\phi)}{\sin(\phi)}\right|=\frac{\cos(\phi)}{\sin(\phi)} \quad (10)$$

In above equation (10), Sign(·) is a sign function that extracts the sign of a value. After the gain adjusting unit 122 applies the gain compensation A to the first compensated signal S1_P(n), a third compensated signal S3_P(n) is generated accordingly. The third compensated signal S3_P(n) may be expressed as follows.

$$S3\_P(n)= \quad (11)$$
$$S1\_P(n)\cdot A=(g\sin(\phi)hQ(n)*x(n))\cdot\frac{\cos(\phi)}{\sin(\phi)}=g\cos(\phi)hQ(n)*x(n)$$

As can be readily seen from above equations (8) and (11), the third compensated signal S3_P(n) of the in-phase branch BR_I and the second compensated signal S2_P(n) of the quadrature branch BR_Q would have the same gain (i.e., g cos(ϕ)hQ(n)) applied thereto. In this way, the gain mismatch remaining in the first and second compensated signals S1_P(n) and S2_P(n) generated from the phase/filter mismatch correction circuit 102 would be successfully removed by the following gain mismatch correction circuit 104.

As shown in FIG. 1, the gain adjusting unit 122 is disposed on the in-phase branch BR_I. However, this is for illustrative purposes only, and is not meant to be a limitation of the present invention. Please refer to FIG. 2, which is a diagram illustrating an imbalance compensator according to a second exemplary embodiment of the present invention. The major difference between the imbalance compensators 100 and 200 is that the gain mismatch correction circuit 204 shown in FIG. 2 has a gain adjusting unit 222 disposed on the quadrature branch BR_Q. Therefore, the first compensated signal S1_P(n) received from the adjustable filter 112 directly serves as an in-phase branch output of the gain mismatch correction circuit 204, and the gain adjusting unit 222 generates a quadrature branch output (i.e., a third compensated signal S3_P'(n)) by applying gain compensation A' to the second compensated signal S2_P(n) generated from the subtractor 114. In this exemplary embodiment, the computing unit 226 is arranged for calculating a square-root power ratio value R' according to the first power value PV1 and the second power value PV2. The square-root power ratio value R' may be expressed as follows.

$$R' = \sqrt{\frac{PV1}{PV2}} = \sqrt{\frac{(g\sin(\phi)hQ(n))^2}{(g\cos(\phi)hQ(n))^2}} = \left|\frac{\sin(\phi)}{\cos(\phi)}\right| \quad (12)$$

The gain control unit 228 is arranged for controlling the gain adjusting unit A' according to the square-root power ratio value R'. For example, the gain adjusting unit A' may be expressed as follows.

$$A' = \text{Sign}\left(\frac{S1\_P(n)}{S2\_P(n)}\right) \cdot R = \text{Sign}\left(\frac{\sin(\phi)}{\cos(\phi)}\right) \cdot \left|\frac{\sin(\phi)}{\cos(\phi)}\right| = \frac{\sin(\phi)}{\cos(\phi)} \quad (13)$$

After the gain adjusting unit 222 applies the gain compensation A' to the second compensated signal S2_P(n), the third compensated signal S3_P'(n) is generated accordingly. The third compensated signal S3_P'(n) may be expressed as follows.

$$S3\_P'(n) = \quad (14)$$
$$S2\_P(n) \cdot A' = (g\cos(\phi)hQ(n) * y(n)) \cdot \frac{\sin(\phi)}{\cos(\phi)} = g\sin(\phi)hQ(n) * y(n)$$

As can be readily seen from above equations (7) and (14), the third compensated signal S3_P'(n) of the quadrature branch BR_Q and the first compensated signal S1_P(n) of the in-phase branch BR_I would have the same net filtering effect (i.e., $g\sin(\phi)hQ(n)$) applied thereto. In this way, the same objective of removing the gain mismatch remaining in the first and second compensated signals S1_P(n) and S2_P(n) generated from the phase/filter mismatch correction circuit 102 is achieved.

Figure 2:
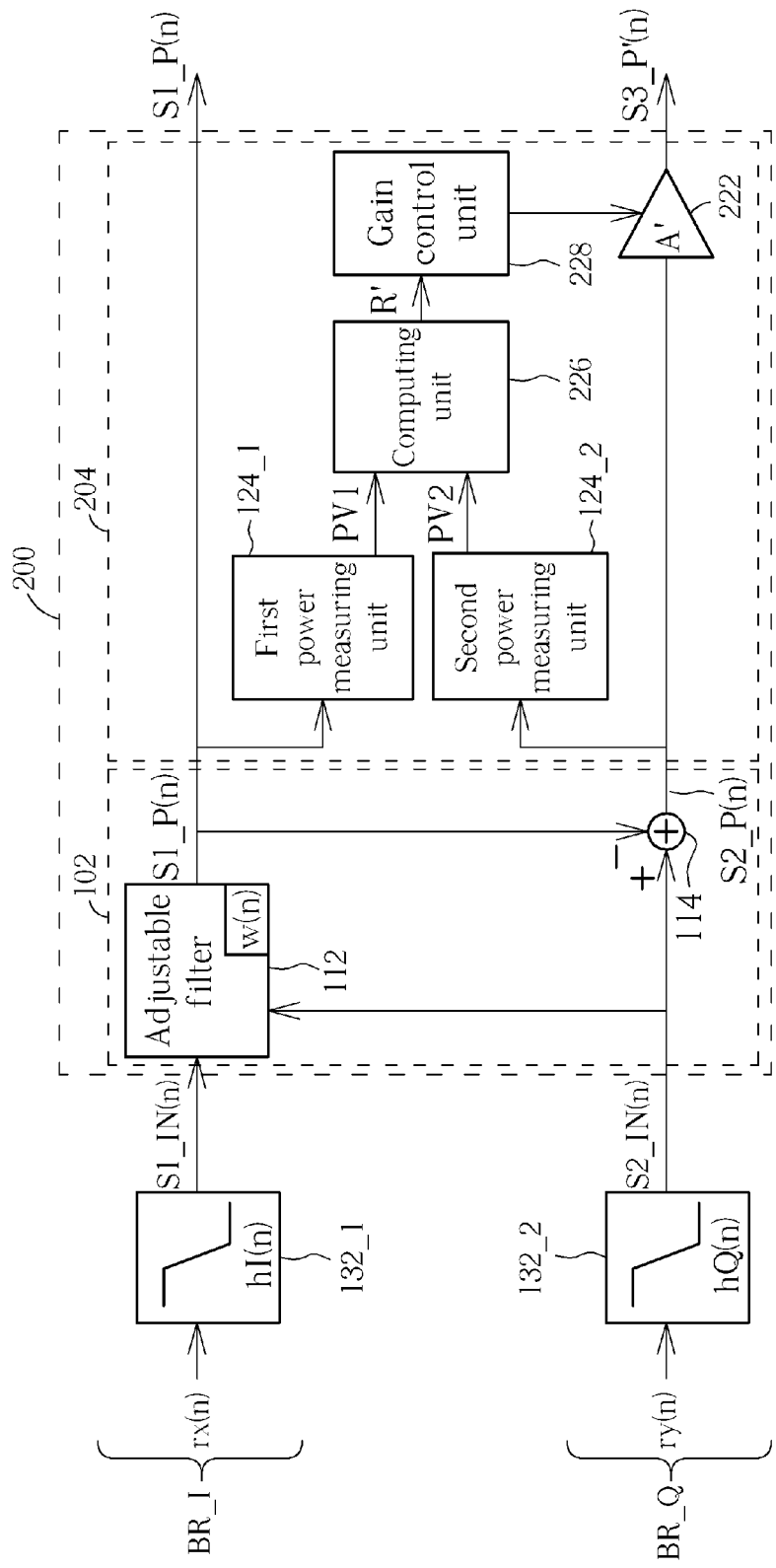
FIG. 2 is a diagram illustrating an imbalance compensator according to a second exemplary embodiment of the present invention.
Figure 3:
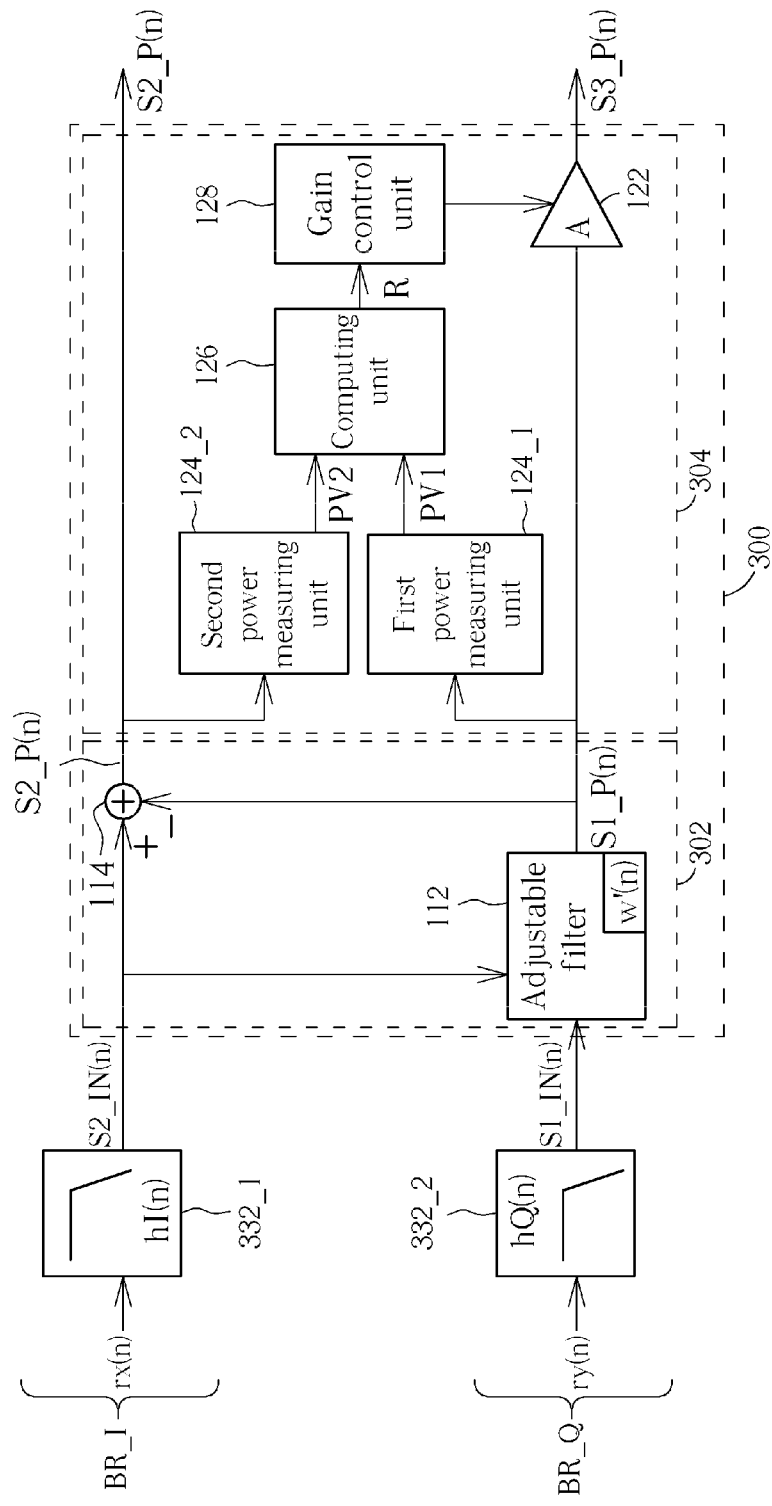
FIG. 3 is a diagram illustrating an imbalance compensator according to a third exemplary embodiment of the present invention.

In above embodiments shown in FIG. 1 and FIG. 2, the adjustable filter 112 is disposed on the in-phase branch BR_I. However, this is for illustrative purposes only, and is not meant to be a limitation of the present invention. Please refer to FIG. 3, which is a diagram illustrating an imbalance compensator according to a third exemplary embodiment of the present invention. Regarding the phase/filter mismatch correction circuit 302, the aforementioned adjustable filter 112 is disposed on the quadrature branch BR_Q, and the aforementioned processing circuit (e.g., the subtractor 114) is disposed on the in-phase branch BR_I. Regarding the gain mismatch correction circuit 304, the aforementioned gain adjusting unit 122 is disposed on the quadrature branch BR_Q. For simplicity, the mixer outputs rx(n) and ry(n) in this exemplary embodiment may be expressed as follows.

$$ry(n) = y(n) = u(n)\cos(\omega n) \quad (15)$$

$$rx(n) = u(n)g(-\sin(\omega n - \phi)) = gx(n)\cos(\phi) + gy(n)\sin(\phi) \quad (16)$$

Besides, suppose that the transfer function hQ(n) of the low-pass filter 332_2 has a unity gain (i.e., hQ(n)=δ(n)), and the transfer function hI(n) of the low-pass filter 332_1 is different from the transfer function hQ(n) (i.e., hQ(n)≠hI(n)). Therefore, regarding this exemplary embodiment, the first input signal S1_IN(n) of the quadrature branch BR_Q, the second input signal S2_IN(n) of the in-phase branch BR_I, the first compensated signal S1_P(n), the second compensated signal S2_P(n), the square-root power ratio value R, the gain compensation A, and the third compensated signal S3_P(n) may be expressed as follows.

$$S1\_IN(n) = y(n) * hQ(n) = y(n) * \delta(n) = y(n) \quad (17)$$

$$S2\_IN(n) = rx(n) * hI(n) = gx(n)\cos(\phi) * hI(n) + gy(n)\sin(\phi) * hI(n) \quad (18)$$

$$S1\_P(n) = S1\_IN(n) \cdot w'(n) = g\sin(\phi)hI(n) * y(n) \quad (19)$$

$$S2\_P(n) = S2\_IN(n) - S1\_P(n) = g\cos(\phi)hI(n) * x(n) \quad (20)$$

$$R = \sqrt{\frac{PV2}{PV1}} = \sqrt{\frac{(g\cos(\phi)hI(n))^2}{(g\sin(\phi)hI(n))^2}} = \left|\frac{\cos(\phi)}{\sin(\phi)}\right| \quad (21)$$

$$A = \text{Sign}\left(\frac{S2\_P(n)}{S1\_P(n)}\right) \cdot R = \text{Sign}\left(\frac{\cos(\phi)}{\sin(\phi)}\right) \cdot \left|\frac{\cos(\phi)}{\sin(\phi)}\right| = \frac{\cos(\phi)}{\sin(\phi)} \quad (22)$$

$$S3\_P(n) = \quad (23)$$
$$S1\_P(n) \cdot A = (g\sin(\phi)hI(n) * y(n)) \cdot \frac{\cos(\phi)}{\sin(\phi)} = g\cos(\phi)hI(n) * y(n)$$

As a person skilled in the art can readily understand operation of the phase/filter mismatch correction circuit 302 and gain mismatch correction circuit 304 after reading above paragraphs directed to the imbalance compensator 100 shown in FIG. 1, further description is omitted here for brevity.

Figure 4:
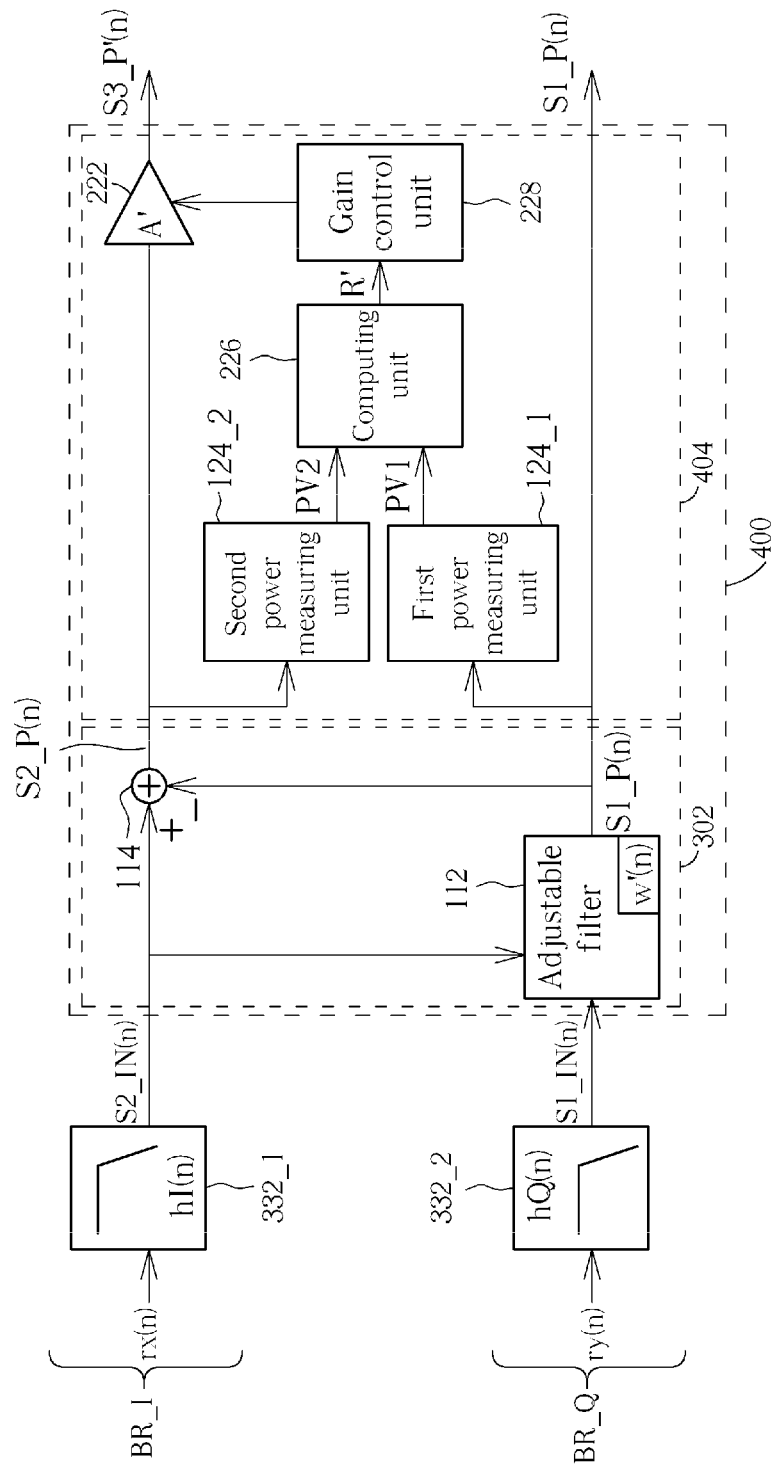
FIG. 4 is a diagram illustrating an imbalance compensator according to a fourth exemplary embodiment of the present invention.

Please refer to FIG. 4, which is a diagram illustrating an imbalance compensator according to a fourth exemplary embodiment of the present invention. The major difference between the imbalance compensators 300 and 400 is that the gain mismatch correction circuit 404 shown in FIG. 4 has the aforementioned gain adjusting unit 222 disposed on the in-phase branch BR_I. Therefore, the first compensated signal S1_P(n) received from the adjustable filter 112 directly serves as a quadrature branch output of the gain mismatch correction circuit 404, and the gain adjusting unit 222 generates an in-phase branch output (i.e., a third compensated signal S3_P'(n)) by applying the gain compensation A' to the second compensated signal S2_P(n) generated from the subtractor 114. In this exemplary embodiment, the computing unit 226 is arranged for calculating a square-root power ratio value R' according to the first power value PV1 and the second power value PV2. The square-root power ratio value R' may be expressed as follows.

$$R' = \sqrt{\frac{PV1}{PV2}} = \sqrt{\frac{(g\sin(\phi)hI(n))^2}{(g\cos(\phi)hI(n))^2}} = \left|\frac{\sin(\phi)}{\cos(\phi)}\right| \quad (24)$$

The gain control unit 228 is arranged for controlling the gain adjusting unit A' according to the square-root power ratio value R'. For example, the gain adjusting unit A' may be expressed as follows.

$$A' = \text{Sign}\left(\frac{S1\_P(n)}{S2\_P(n)}\right) \cdot R = \text{Sign}\left(\frac{\sin(\phi)}{\cos(\phi)}\right) \cdot \left|\frac{\sin(\phi)}{\cos(\phi)}\right| = \frac{\sin(\phi)}{\cos(\phi)} \quad (25)$$

After the gain adjusting unit 222 applies the gain compensation A' to the second compensated signal S2_P(n), the third compensated signal S3_P'(n) is generated accordingly. The third compensated signal S3_P'(n) may be expressed as follows.

$$S3\_P'(n) = \qquad (26)$$
$$S2\_P(n) \cdot A' = (g\cos(\phi)hI(n) * x(n)) \cdot \frac{\sin(\phi)}{\cos(\phi)} = g\sin(\phi)hQ(n) * x(n)$$

As a person skilled in the art can readily understand operation of the phase/filter mismatch correction circuit 302 and gain mismatch correction circuit 404 included in the imbalance compensator 400 after reading above paragraphs directed to the imbalance compensator 200 shown in FIG. 2, further description is omitted here for brevity.

As can be seen from equations (10), (13), (22), and (25), the setting of the gain compensation A/A' is dominated by a phase mismatch φ between the LO signals. If the phase mismatch φ is small, implying sin(φ)<<cos(φ), the setting of the gain compensation A will overwhelmingly suffer power estimation error due to the fact that a small error of measuring the power of the compensated signal generated from the preceding phase/filter mismatch correction circuit may lead to a significant deviation of the gain compensation A. Similarly, if the phase mismatch φ is large, implying cos(φ)<<sin(φ), the setting of the gain compensation A' will overwhelmingly suffer power estimation error due to the fact that a small error of measuring the power of the compensated signal generated from the preceding phase/filter mismatch correction circuit may lead to a significant deviation of the gain compensation A'. Therefore, to mitigate the power estimation error, a predetermined phase mismatch intentionally introduced between the LO signals used by in-phase branch mixer and quadrature branch mixer should be properly configured to make the gain compensation A fall within a specific range. For example, $$\frac{1}{10} < |A| < 10.$$

In a preferred embodiment, the predetermined phase mismatch is equal to 45°, 135°, 225°, or 315°, thus making cos(φ) about the same magnitude as sin(φ). In this way, the power estimation error caused gain deviation effect would be minimized. Another reason for deliberately making the phase mismatch deviated from about 0° to, say 45°, is that the gain compensation value A is cos(φ)/sin(φ), as expressed in equation (10), and we can only have its magnitude R, which is |cos(φ)/sin(φ)| as expressed in equation (9). We need a sign value to convert R into A. Estimation error makes it very difficult to determine the sign value since it is around 0° and we do not have information about it. Determining the sign value becomes easy since the sign would be +1 if is shifted to around 45°. Similar conditions happen if we deliberately shift to around 135°, 225°, or 315°. As is known by those skilled in analog circuit design, deliberate phase shift by the aforementioned amount can be easily achieved by minor revision of the oscillator circuit.

Figure 5:
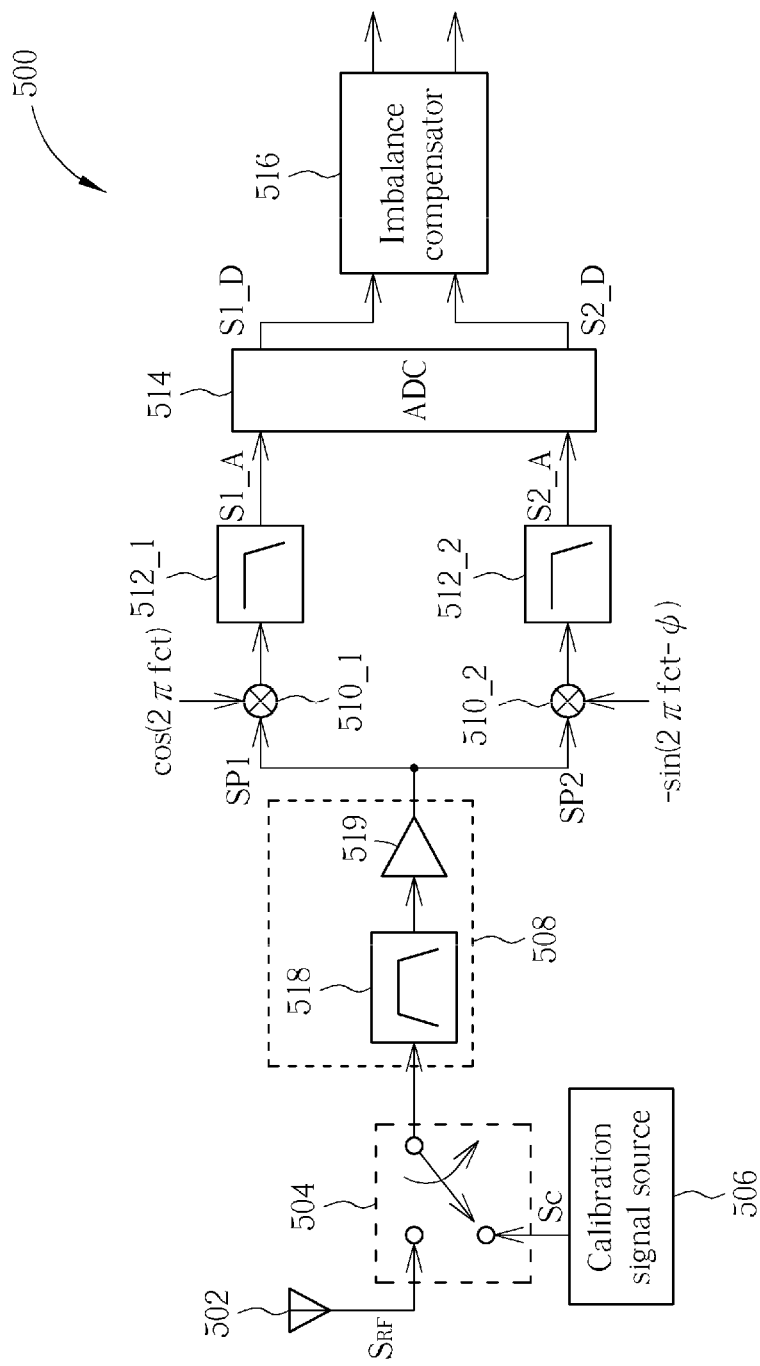
FIG. 5 is a diagram illustrating a direct conversion receiving (DCR) apparatus according to one exemplary embodiment of the present invention.

FIG. 5 is a diagram illustrating a direct conversion receiving (DCR) apparatus according to one exemplary embodiment of the present invention. The DCR apparatus 500 may operate in either a normal mode or a calibration mode. As shown in FIG. 5, the DCR apparatus 500 includes an antenna 502, a switch device 504, a calibration signal source 506, an analog front-end (AFE) 508, a first mixer 510_1, a second mixer 510_2, a first filter (e.g., a low-pass filter) 512_1, a second filter (e.g., a low-pass filter) 512_2, an analog-to-digital converter (ADC) 514, and an imbalance compensator 516.

By way of example, but not limitation, the AFE 508 may include a band selection filter 518 and a low noise amplifier (LNA) 519. When the DCR apparatus 500 is operated in the normal mode, the switch device 504 would be controlled to select the radio frequency signal $S_{RF}$ received by the antenna 502 as its output. When the DCR apparatus 500 is operated in the calibration mode, the switch device 504 would be controlled to select the calibration signal (e.g., a white noise signal) $S_C$ generated from the calibration signal source 506 as its output. Next, the calibration signal $S_C$ is processed by the AFE 508 and then fed into a first signal branch SP1 and a second signal branch SP2. As a quadrature down-conversion scheme is employed, one of the first signal branch SP1 and the second signal branch SP2 would act as an in-phase branch, and the other of the first signal branch SP1 and the second signal branch SP2 would act as a quadrature branch.

In this exemplary embodiment, the ADC 514 is implemented for converting first input signal S1_A and second input signal S2_A in an analog domain into first input signal S1_D and second input signal S2_D in a digital domain. Therefore, in this exemplary embodiment, the imbalance compensator 516 is a digital-domain off-line compensator. For example, the imbalance compensator 516 may be realized using an exemplary circuit configuration of one of the aforementioned imbalance compensators 100, 200, 300, and 400. As a person skilled in the art can readily understand operations of the first mixer 510_1, second mixer 510_2, the first filter 512_1, the second filter 512_2, and the imbalance compensator 516 after reading above paragraphs, further description is omitted for brevity. Note that in conventional scheme, the first mixer 510_1 and the second mixer 510_2 are designed to be phase-quadrature, i.e., 90° phase difference; but in the present invention, they are designed to have phase difference of 45°, 135°, 225°, or 315°.

As clearly shown in FIG. 5, there is no switch device disposed between the first filter 512_1 and the first mixer 510_1, and there is no switch device disposed between the second filter 512_2 and the second mixer 510_2. Hence, the first filter 512_1 is consistently coupled to the preceding first mixer 510_1 and the second filter 512_2 is consistently coupled to the preceding second mixer 510_2 no matter whether the imbalance compensator 516 is correcting the phase/filter mismatch or the gain mismatch. Besides, as the same calibration signal source 506 is shared by the phase/filter mismatch correction and gain mismatch correction, the calibration signal source 506 is consistently coupled to the first and second mixers 510_1 and 510_2 no matter whether the imbalance compensator 516 is correcting the phase/filter mismatch or the gain mismatch. Compared to the conventional DCR apparatus employing a two-stage correction scheme, the DCR apparatus 500 employing a simultaneous filter and oscillator correction (i.e., a simultaneous gain and phase mismatch correction) is capable of correction the gain mismatch and phase/filter mismatch efficiently and precisely.

Figure 6:
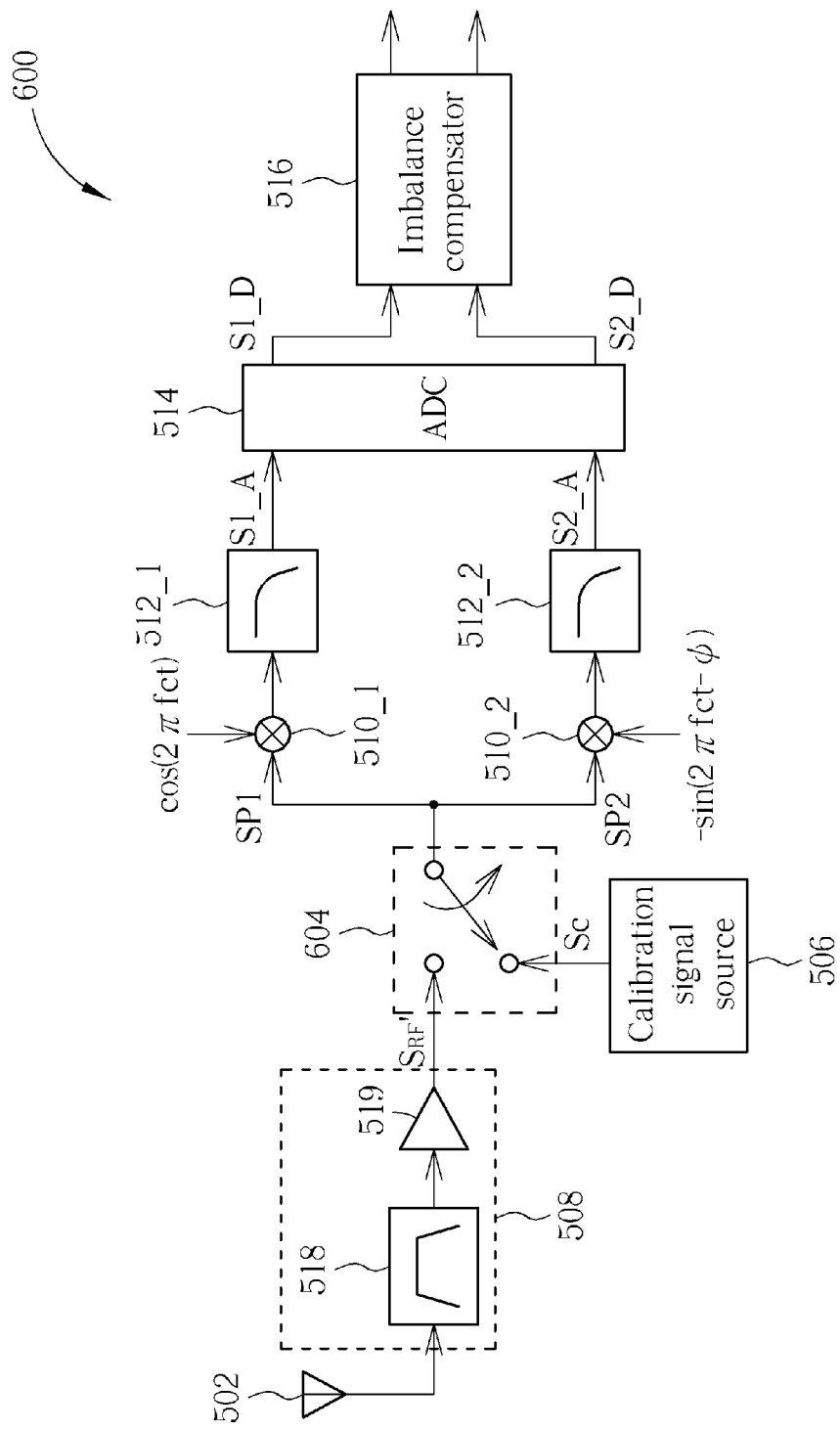
FIG. 6 is a diagram illustrating a DCR apparatus according to another exemplary embodiment of the present invention.

In the exemplary embodiment shown in FIG. 5, the switch device 504 is placed before the AFE 508. However, this is for illustrative purposes only, and is not meant to be a limitation of the present invention. Please refer to FIG. 6, which is a diagram illustrating a DCR apparatus according to another exemplary embodiment of the present invention. The major difference between the DCR apparatuses 500 and 600 is that the switch device 604 shown in FIG. 6 is placed between the AFE 508 and the first and second mixers 510_1 and 510_2. Thus, the radio frequency signal $S_{RF}$ received by the antenna 502 is processed by the AFE 508 before transmitted to the following switch device 604. When the DCR apparatus 600 is operated in the normal mode, the switch device 604 would be controlled to select the radio frequency signal $S_{RF}'$ generated from the AFE 508 as its output. When the DCR apparatus 600 is operated in the calibration mode, the switch device 604 would be controlled to select the calibration signal (e.g., a white noise signal) $S_C$ generated from the calibration signal source 506 as its output.

As can be seen from FIG. 6, the same objective of correcting the gain mismatch and phase/filter mismatch efficiently and precisely is achieved since the DCR apparatus 600 still makes the first filter 512_1 consistently coupled to the first mixer 510_1, the second filter 512_2 consistently coupled to the second mixer 510_2, and the calibration signal source 506 consistently coupled to the first and second mixers 510_1 and 510_2 no matter whether the imbalance compensator 516 is correcting the phase/filter mismatch or the gain mismatch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An imbalance compensator for correcting a phase/filter mismatch and a gain mismatch between a first signal branch and a second signal branch, one of the first and second signal branches being an in-phase branch, the other of the first and second signal branches being a quadrature branch, the imbalance compensator comprising:
    a phase/filter mismatch correction circuit, comprising:
        an adjustable filter, disposed on the first signal branch, the adjustable filter arranged for adjusting a filter coefficient setting according to a first input signal of the first signal branch and a second input signal of the second signal branch, and generating a first compensated signal to the first signal branch according to the filter coefficient setting and the first input signal; and
        a processing unit, disposed on the second signal branch, the processing unit arranged for processing the second input signal according to the first compensated signal and accordingly generating a second compensated signal; and
    a gain mismatch correction circuit, arranged for referring to the first and second compensated signals to configure gain compensation, and applying the configured gain compensation to a specific compensated signal being one of the first and second compensated signals.

2. The imbalance compensator of claim 1, wherein the processing unit is a subtractor arranged for generating the second compensated signal by subtracting the first compensated signal from the second input signal.

3. The imbalance compensator of claim 1, wherein the adjustable filter employs a system identification method (SID) for adjusting the filter coefficient setting.

4. The imbalance compensator of claim 1, wherein the gain mismatch correction circuit comprises:
    a gain adjusting unit, arranged for applying the gain compensation to the specific compensated signal;
    a first power measuring unit, arranged for generating a first power value indicative of signal power of the first compensated signal;
    a second power measuring unit, arranged for generating a second power value indicative of signal power of the second compensated signal;
    a computing unit, arranged for calculating a square-root power ratio value according to the first power value and the second power value; and
    a gain control unit, arranged for controlling the gain adjusting unit according to the square-root power ratio value.

5. The imbalance compensator of claim 1, wherein the gain mismatch correction circuit is consistently cascaded to the phase/filter mismatch correction circuit while the phase/filter mismatch correction circuit is adjusting the filter coefficient setting and the gain mismatch correction circuit is configuring the gain compensation.

6. An imbalance compensation method for correcting a phase/filter mismatch and a gain mismatch between a first signal branch and a second signal branch, one of the first and second signal branches being an in-phase branch, the other of the first and second signal branches being a quadrature branch, the imbalance compensation method comprising:
    performing a phase/filter mismatch correction, comprising:
        adjusting a filter coefficient setting according to a first input signal of the first signal branch and a second input signal of the second signal branch;
        performing a filtering operation upon the first input signal according to the filter coefficient setting, and accordingly generating a first compensated signal; and
        processing the second input signal according to the first compensated signal and accordingly generating a second compensated signal; and
    performing a gain mismatch correction, comprising:
        referring to the first and second compensated signals to configure gain compensation; and
        applying the configured gain compensation to a specific compensated signal being one of the first and second compensated signals.

7. The imbalance compensation method of claim 6, wherein the step of processing the second input signal according to the first compensated signal and accordingly generating the second compensated signal comprises:
    generating the second compensated signal by subtracting the first compensated signal from the second input signal.

8. The imbalance compensation method of claim 6, wherein the step of adjusting the filter coefficient setting according to the first input signal of the first signal branch and the second input signal of the second signal branch comprises:
    employing a system identification method (SID) for adjusting the filter coefficient setting.

9. The imbalance compensation method of claim 6, wherein the step of referring to the first and second compensated signals to configure the gain compensation comprises:
    generating a first power value indicative of signal power of the first compensated signal;
    generating a second power value indicative of signal power of the second compensated signal;
    calculating a square-root power ratio value according to the first power value and the second power value; and
    controlling the gain compensation according to the square-root power ratio value.

10. The imbalance compensation method of claim 6, wherein the gain mismatch correction is performed while the phase/filter mismatch correction is performed.

11. A direct conversion receiving (DCR) apparatus, comprising:
- a first mixer, disposed on a first signal branch and arranged for generating a first mixer output according to a first clock signal and a calibration signal when the DCR apparatus is operated in a calibration mode;
- a second mixer, disposed on a second signal branch and arranged for generating a second mixer output according to a second clock signal and the calibration signal when the DCR apparatus is operated in a calibration mode, wherein one of the first and second signal branches is an in-phase branch, and the other of the first and second signal branches is a quadrature branch;
- a first filter, arranged for generating a first input signal of the first signal branch according to the first mixer output;
- a second filter, arranged for generating a second input signal of the second signal branch according to the second mixer output; and
- an imbalance compensator, coupled to the first and second filters and arranged for correcting a phase/filter mismatch and a gain mismatch between the first signal branch and the second signal branch according to the first and second input signals;
- wherein the first filter is consistently coupled to the first mixer and the second filter is consistently coupled to the second mixer no matter whether the imbalance compensator is correcting the phase/filter mismatch or the gain mismatch, a predetermined phase mismatch is intentionally introduced between the first clock signal and the second clock signal, and the predetermined phase mismatch is equal to 45°, 135°, 225°, or 315°.

12. The DCR apparatus of claim 11, further comprising:
- a calibration signal source, arranged for generating the calibration signal;
- wherein the calibration signal source is consistently coupled to the first and second mixers no matter whether the imbalance compensator is correcting the phase/filter mismatch or the gain mismatch.

13. A direct conversion receiving (DCR) apparatus, comprising:
- a first mixer, disposed on a first signal branch and arranged for generating a first mixer output according to a first clock signal and a calibration signal when the DCR apparatus is operated in a calibration mode;
- a second mixer, disposed on a second signal branch and arranged for generating a second mixer output according to a second clock signal and the calibration signal when the DCR apparatus is operated in a calibration mode, wherein one of the first and second signal branches is an in-phase branch, and the other of the first and second signal branches is a quadrature branch;
- a first filter, arranged for generating a first input signal of the first signal branch according to the first mixer output;
- a second filter, arranged for generating a second input signal of the second signal branch according to the second mixer output; and
- an imbalance compensator, coupled to the first and second filters and arranged for correcting a phase/filter mismatch and a gain mismatch between the first signal branch and the second signal branch according to the first and second input signals;
- wherein the first filter is consistently coupled to the first mixer and the second filter is consistently coupled to the second mixer no matter whether the imbalance compensator is correcting the phase/filter mismatch or the gain mismatch; and the imbalance compensator comprises:
  - a phase/filter mismatch correction circuit, comprising:
    - an adjustable filter, disposed on the first signal branch, the adjustable filter arranged for adjusting a filter coefficient setting according to the first input signal and the second input signal, and generating a first compensated signal to the first signal branch according to the filter coefficient setting and the first input signal; and
    - a processing unit, disposed on the second signal branch, the processing unit arranged for processing the second input signal according to the first compensated signal and accordingly generating a second compensated signal; and
  - a gain mismatch correction circuit, arranged for referring to the first and second compensated signals to configure gain compensation, and applying the configured gain compensation to a specific compensated signal being one of the first and second compensated signals.

14. The DCR apparatus of claim 13, wherein the processing unit is a subtractor arranged for generating the second compensated signal by subtracting the first compensated signal from the second input signal.

15. The DCR apparatus of claim 13, wherein the adjustable filter employs a system identification method (SID) for adjusting the filter coefficient setting.

16. The DCR apparatus of claim 13, wherein the gain mismatch correction circuit comprises:
- a gain adjusting unit, arranged for applying the gain compensation to the specific compensated signal;
- a first power measuring unit, arranged for generating a first power value indicative of signal power of the first compensated signal;
- a second power measuring unit, arranged for generating a second power value indicative of signal power of the second compensated signal;
- a computing unit, arranged for calculating a square-root power ratio value according to the first power value and the second power value; and
- a gain control unit, arranged for controlling the gain adjusting unit according to the square-root power ratio value.

17. The DCR apparatus of claim 13, wherein the gain mismatch correction circuit is consistently cascaded to the phase/filter mismatch correction circuit while the phase mismatch correction circuit is adjusting the filter coefficient setting and the gain mismatch correction circuit is configuring the gain compensation.

18. A direct conversion receiving (DCR) apparatus, comprising:
- a first mixer, disposed on a first signal branch and arranged for generating a first mixer output according to a first clock signal and a calibration signal when the DCR apparatus is operated in a calibration mode;
- a second mixer, disposed on a second signal branch and arranged for generating a second mixer output according to a second clock signal and the calibration signal when the DCR apparatus is operated in a calibration mode, wherein one of the first and second signal branches is an in-phase branch, and the other of the first and second signal branches is a quadrature branch;
- a calibration signal source, arranged for generating a white noise signal as the calibration signal;
- a first filter, arranged for generating a first input signal of the first signal branch according to the first mixer output;
- a second filter, arranged for generating a second input signal of the second signal branch according to the second mixer output; and an imbalance compensator, coupled to the first and second filters and arranged for correcting a phase/filter mismatch and a gain mismatch between the first signal branch and the second signal branch according to the first and second input signals.

\* \* \* \* \*